United States Patent
Lai et al.

(10) Patent No.: US 7,423,328 B2
(45) Date of Patent: Sep. 9, 2008

(54) METHOD FOR REDUCING WORD LINE CURRENT IN MAGNETORESISTIVE RANDOM ACCESS MEMORY AND STRUCTURE THEREOF

(75) Inventors: James Chyi Lai, St. Paul, MN (US); Tom Allen Agan, St. Paul, MN (US)

(73) Assignee: Northern Lights Semiconductor Corp., St. Paul, MN (US)

( * ) Notice: Subject to any disclaimer, the term of this patent is extended or adjusted under 35 U.S.C. 154(b) by 1 day.

(21) Appl. No.: 11/539,296

(22) Filed: Oct. 6, 2006

(65) Prior Publication Data

US 2007/0086233 A1 Apr. 19, 2007

Related U.S. Application Data

(60) Provisional application No. 60/727,345, filed on Oct. 17, 2005.

(51) Int. Cl.
*H01L 29/82* (2006.01)
*H01L 43/00* (2006.01)

(52) U.S. Cl. .................................. 257/421; 257/422

(58) Field of Classification Search .......... 257/421–427
See application file for complete search history.

(56) References Cited

U.S. PATENT DOCUMENTS

| | | | | |
|---|---|---|---|---|
| 6,147,922 | A  * | 11/2000 | Hurst et al. | 365/225.5 |
| 6,714,441 | B1 * | 3/2004 | Fulkerson et al. | 365/158 |
| 7,132,707 | B2 * | 11/2006 | Min et al. | 257/295 |
| 2006/0120147 | A1 * | 6/2006 | Peng et al. | 365/158 |

* cited by examiner

*Primary Examiner*—Cuong Q Nguyen
(74) *Attorney, Agent, or Firm*—Thomas, Kayden, Horstemeyer & Risley

(57) ABSTRACT

The method for reducing word line currents in magnetoresistive random access memory (MRAM) includes disposing the MRAM bit between a pair of word lines according to a magnetic field strength is increased when a distance between a magnetic section and its corresponding word line is decreased.

9 Claims, 1 Drawing Sheet

METHOD FOR REDUCING WORD LINE CURRENT IN MAGNETORESISTIVE RANDOM ACCESS MEMORY AND STRUCTURE THEREOF

CROSS-REFERENCE TO RELATED APPLICATION

This application claims the priority benefit of U.S. Provisional Application Ser. No. 60/727,345, filed Oct. 17, 2005, the full disclosures of which are incorporated herein by reference.

BACKGROUND

1. Field of Invention

The present invention generally relates to memory technology. More particularly, the present invention relates to non-volatile magnetic memory.

2. Description of Related Art

Magnetoresistive random access memory (MRAM) is a type of non-volatile memory with fast programming time and high density. An MRAM cell of giant magnetoresistance (GMR) has two magnetic layers separated by a nonmagnetic conducting layer. Information is stored as directions of magnetization vectors in the two magnetic layers.

The resistance of the nonmagnetic conducting layer between the two magnetic layers indicates a minimum value when the magnetization vectors of the two magnetic layers point in substantially the same direction. On the other hand, the resistance of the nonmagnetic conducting layer between the two magnetic layers indicates a maximum value when the magnetization vectors of the two magnetic layers point in substantially opposite directions. Accordingly, a detection of changes in resistance allows information being stored in the MRAM.

In the conventional standard MRAM structural design, an MRAM bit lies between a pair of word lines arranged at right angles to each other, above and below the MRAM bit. A magnetic field is generated when current flows along the word line. Usually, a fairly substantial current is required to generate the magnetic field to control a dipole of the corresponding magnetic layer, which results in higher power consumption.

For the foregoing reason, there is a need for developing a method and a structure to reduce a current required for the word line, which controls a dipole of the magnetic layer.

SUMMARY

A method for reducing word line currents in magnetoresistive random access memory (MRAM) includes disposing an MRAM bit between a pair of word lines according to a magnetic field strength is squared when a distance between the MRAM bit and the corresponding word line is halved.

A magnetic random access memory includes an MRAM bit and at least two word lines. The MRAM bit includes a conductive section disposed between and in direct contact with both a first and second magnetic section. One of the word lines disposed adjacent to and has a distance of 50 Angstroms to 200 Angstroms with the first magnetic section, is capable of generating a first magnetic field to control a dipole of the first magnetic section when a smaller first current flows on the word line. The other word line disposed adjacent to and has a distance of 50 Angstroms to 200 Angstroms with the second magnetic section, is capable of generating a second magnetic field to control a dipole of the second magnetic section when a smaller second current flows on the word line. The first or second current is derived according to the magnetic field strength is increased in square when the distance between the word line and the corresponding magnetic section is halved.

A magnetic random access memory includes an MRAM bit and at least two word lines. The MRAM bit includes a conductive section disposed between and in direct contact with both a first and second magnetic section. One of the word lines disposed adjacent to and has a distance of 50 Angstroms to 200 Angstroms with the first magnetic section, is capable of generating a first magnetic field to control a dipole of the first magnetic section when a first current flows on the word line. The other word line disposed adjacent to and has a distance of 50 Angstroms to 200 Angstroms with the second magnetic section, is capable of generating a second magnetic field to control a dipole of the second magnetic section when a second current flows on the word line. A much larger magnetic field strength is obtained when the distance between the word line and the corresponding magnetic section is decreased with the first or second current is unchanged.

It is to be understood that both the foregoing general description and the following detailed description are by examples, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates embodiments of the invention and, together with the description, serve to explain the principles of the invention. In the drawing.

DESCRIPTION OF THE PREFERRED EMBODIMENTS

Figure 1:
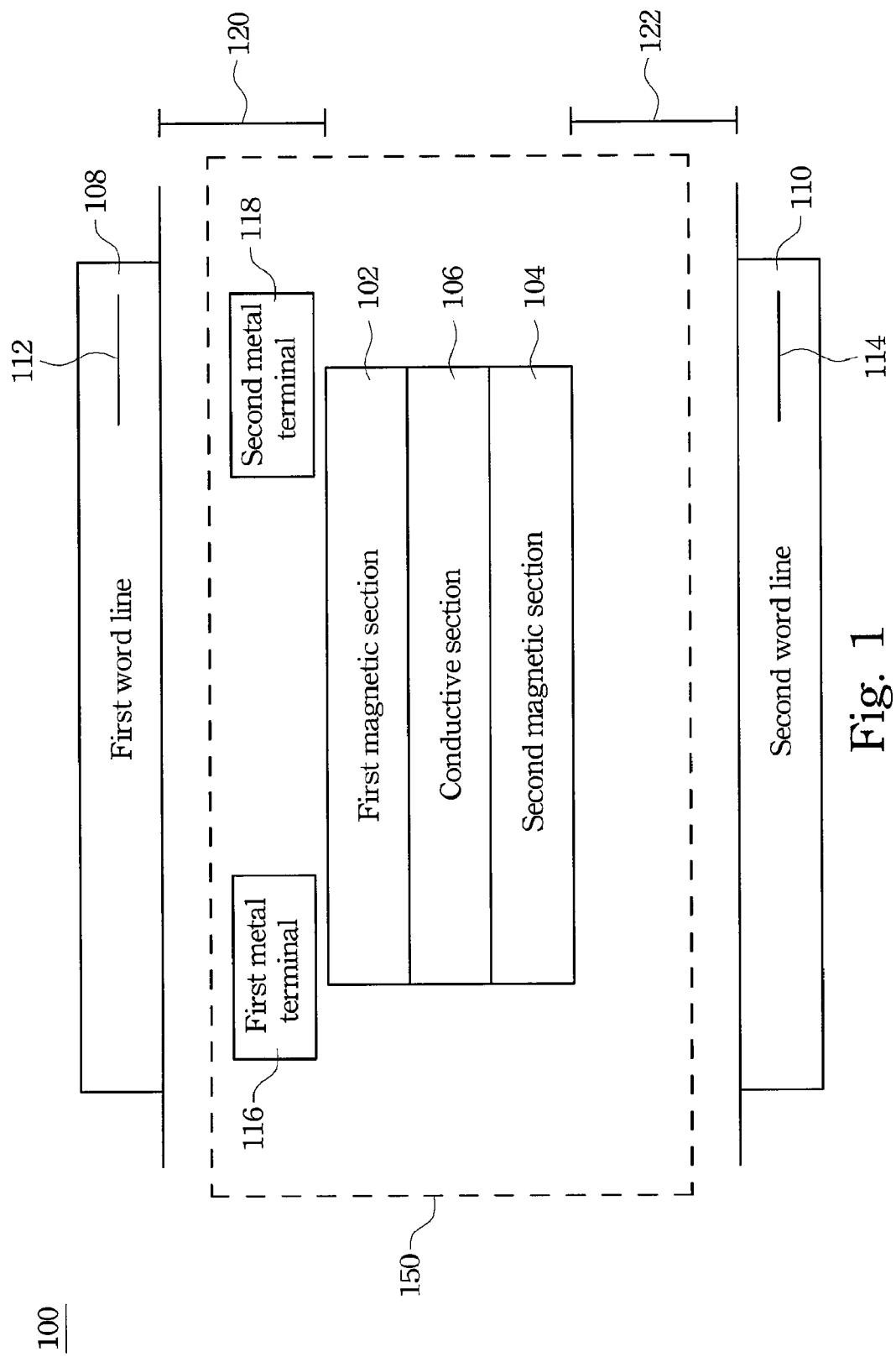
FIG. 1 depicts a cross-sectional view of an MRAM bit disposed between a pair of the word lines according to one embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

FIG. 1 depicts a cross-sectional view of an MRAM bit disposed between a pair of the word lines according to one embodiment of this invention. An MRAM memory 100 includes an MRAM bit 150, a first word line 108, and a second word line 110. The MRAM bit 150 includes a first magnetic section 102, a second magnetic section 104, and a conductive section 106. Those skilled in the art will recognize the first magnetic section 102, and the second magnetic section 104, for example, are made up from multiple magnetic layers. The first word line 108 and the second word line 110, for example, is made up from a metal, or metal alloy (not shown).

The conductive section 106 is disposed between and is in direct contact with the first magnetic section 102 and the second magnetic section 104. For example, the conductive section 106 is formed on the second magnetic section 104, and the first magnetic section 102 is formed on the conductive section 106.

The first word line 108 is disposed to the first magnetic section 102 with a first distance 120. The first word line 108 is capable of generating a first magnetic field to control a dipole of the first magnetic section 102 when a first current 112 flows on the first word line 108. The second word line 110 is disposed to the second magnetic section 104 with a second distance 122. The second word line 110 is capable of generating a second magnetic field to control a dipole of the second magnetic section 104 when a second current 114 flows on the second word line 110.

The first distance 120 is smaller than a distance of a conventional MRAM bit to its corresponding word line according to the magnetic field strength is increased in square when the distance between the word line and the corresponding magnetic section is halved. Hence, the first current 112 can be derived from the above statement, which has a smaller current than conventionally required. For example, the first distance 120 is in the range of 50 Angstroms to 200 Angstroms.

The second distance 122 is smaller than a distance of a conventional MRAM bit to its corresponding word line according to the magnetic field strength is increased in square when the distance between the word line and the corresponding magnetic section is halved. Hence, the second current 114 can be derived from the above statement, which has a smaller current than conventionally required. For example, the second distance 122 is in the range of 50 Angstroms to 200 Angstroms.

In other words, the magnetic field strength of the first magnetic section 102 is increased when the first current 112 remains constant (for example, the first current 112 is unchanged) and the distance between the first word line 108 and the first magnetic section 102 is decreased. Also, the magnetic field strength of the second magnetic section 104 is increased when the second current 114 remains constant (for example, the second current 114 is unchanged) and the distance between the second word line 108 and the second magnetic section 104 is decreased.

The MRAM 100 further includes a first metal terminal 116 and a second metal terminal 118. The first metal terminal 116 is disposed on one end of an opposite surface to the conductive section 106 of the first magnetic section 102. The second metal terminal 118 is disposed on the other end of the opposite surface to the conductive section 106 of the first magnetic section 102.

When the MRAM 100 is turned on, a current (not shown) flows from the first metal terminal 116 and is outputted from the second metal terminal 118, or the current flows from the second metal terminal 118 and is outputted from the first metal terminal 116.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for reducing word line currents in magnetoresistive random access memory (MRAM), comprising:
    forming an MRAM bit, comprising:
        forming a conductive section on a first magnetic section;
        forming a second magnetic section on the conductive section;
        forming a first metal terminal adjacent to one end of an opposite surface to the conductive section of the first magnetic section; and
        forming a second metal terminal adjacent to the other end of the opposite surface to the conductive section of the first magnetic section; and
    disposing the MRAM bit between a first word line and a second word line, wherein the first word line is capable of generating a first magnetic field to control a dipole of the first magnetic section when a first current flows on the first word line, the second word line is capable of generating a second magnetic field to control a dipole of the second magnetic section when a second current flows on the second word line, and the first or second current is derived according to a magnetic field strength squared when a distance from the first magnetic section or the second magnetic section to the corresponding word line is halved.

2. The method as claimed in claim 1, wherein a first distance from the first magnetic section to the first word line is in the range of 50 Angstroms to 200 Angstroms.

3. The method as claimed in claim 1, wherein a second distance from the second magnetic section to the second word line is in the range of 50 Angstroms to 200 Angstroms.

4. A magnetoresistive random access memory (MRAM), comprising:
    an MRAM bit, comprising:
        a first magnetic section;
        a second magnetic section;
        a conductive section, disposed between and in direct contact with both the first and second magnetic section;
        a first metal terminal disposed adjacent to one end of an opposite surface to the conductive section of the first magnetic section; and
        a second metal terminal disposed adjacent to the other end of the opposite surface to the conductive section of the first magnetic section; and
    at least two word lines, one of the word lines being disposed adjacent to the first magnetic section and capable of generating a first magnetic field to control a dipole of the first magnetic section when a first current flows on the word line, the other of the word lines being disposed adjacent to the second magnetic section and capable of generating a second magnetic field to control a dipole of the second magnetic section when a second current flows on the word line,
    wherein the first or second current is derived according to a magnetic field strength increased in square when a distance between the word line and the corresponding magnetic section is halved.

5. The MRAM as claimed in claim 4, wherein a distance between the first magnetic section and one of the word line is in the range of 50 Angstroms to 200 Angstroms.

6. The MRAM as claimed in claim 5, wherein another distance between the second magnetic section and the other of the word line is in the range of 50 Angstroms to 200 Angstroms.

7. A magnetoresistive random access memory (MRAM), comprising:
    an MRAM bit, comprising:
        a first magnetic section;
        a second magnetic section;

a conductive section, disposed between and in direct contact with both the first and second magnetic section;

a first metal terminal disposed adjacent to one end of an opposite surface to the conductive section of the first magnetic section; and a second metal terminal disposed on the other end of the opposite surface to the conductive section of the first magnetic section; and at least two word lines, one of the word lines being disposed adjacent to the first magnetic section and capable of generating a first magnetic field to control a dipole of the first magnetic section when a first current flows on the word line, the other of the word lines being disposed adjacent to the second magnetic section and capable of generating a second magnetic field to control a dipole of the second magnetic section when a second current flows on the word line, wherein a much larger magnetic field strength is obtained when a distance between the word line and the corresponding magnetic section is decreased and the first or second current is unchanged.

8. The MRAM as claimed in claim 7, wherein a distance between the first magnetic section and one of the word line is in the range of 50 Angstroms to 200 Angstroms.

9. The MRAM as claimed in claim 8, wherein another distance between the second magnetic section and the other of the word line is in the range of 50 Angstroms to 200 Angstroms.

* * * * *